United States Patent
Inano et al.

(10) Patent No.: US 10,624,236 B2
(45) Date of Patent: Apr. 14, 2020

(54) LIQUID IMMERSION TANK

(71) Applicant: FUJITSU LIMITED, Kawasaki-shi, Kanagawa (JP)

(72) Inventors: Satoshi Inano, Minoh (JP); Hiroyuki Fukuda, Yokohama (JP); Minoru Ishinabe, Atsugi (JP); Yukiko Wakino, Sagamihara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/504,685

(22) Filed: Jul. 8, 2019

(65) Prior Publication Data
US 2020/0029464 A1     Jan. 23, 2020

(30) Foreign Application Priority Data
Jul. 17, 2018     (JP) .................. 2018-134395

(51) Int. Cl.
  *H05K 7/20*     (2006.01)
  *F28F 23/02*    (2006.01)
(52) U.S. Cl.
  CPC ......... *H05K 7/20272* (2013.01); *F28F 23/02* (2013.01); *H05K 7/20236* (2013.01)
(58) Field of Classification Search
  None
  See application file for complete search history.

(56) References Cited

U.S. PATENT DOCUMENTS

| 10,212,849 | B2 * | 2/2019 | Matsumoto | ........ H05K 7/20236 |
| 10,279,653 | B2 * | 5/2019 | Takagi | ............... B60H 1/00914 |
| 2016/0234970 | A1 * | 8/2016 | Shelnutt | ............. H05K 7/20809 |
| 2017/0265336 | A1 * | 9/2017 | Ichinose | ........... H05K 7/20772 |
| 2017/0354061 | A1 | 12/2017 | Saito | |
| 2018/0084670 | A1 * | 3/2018 | Hirai | .................. H05K 7/20272 |
| 2018/0218924 | A1 * | 8/2018 | Tanaka | .............. H01L 21/67313 |
| 2019/0357385 | A1 * | 11/2019 | Miyazaki | ........... H05K 7/20236 |

FOREIGN PATENT DOCUMENTS

| JP | 2017-150715 | 8/2017 |
| WO | 2016/088280 | 6/2016 |

* cited by examiner

*Primary Examiner* — Courtney L Smith
(74) *Attorney, Agent, or Firm* — Fujitsu Patent Center

(57) ABSTRACT

A liquid immersion tank includes an outer-case to have a first hole in a side-wall of the outer-case and an opening at a top of the outer-case, an inner-case to have a second hole in a side-wall of the inner-case and an opening at a top of the inner-case, the inner-case being contained in the outer-case and containing an electronic device to be cooled by a coolant, and a spring to support the inner-case to be able to move between a first position and a second position disposed above the first position, cause, when the inner-case is at the first position, the second hole to communicate with the first hole so that the coolant flow into the inner-case, and cause, when the inner-case is at the second position, the second hole to face the side-wall of the outer-case so that the coolant is prevented to flow into the inner-case.

13 Claims, 12 Drawing Sheets

LIQUID IMMERSION TANK

CROSS-REFERENCE TO RELATED APPLICATION

This application is based upon and claims the benefit of priority of the prior Japanese Patent Application No. 2018-134395, filed on Jul. 17, 2018, the entire contents of which are incorporated herein by reference.

FIELD

The embodiments discussed herein are related to a liquid immersion tank.

BACKGROUND

Nowadays, a technique is discussed with which a plurality of electronic units are received in a liquid immersion tank storing coolant and immersed in the coolant so as to be cooled (see, for example, International Publication Pamphlet No. WO 2016/088280 and Japanese Laid-open Patent Publication No. 2017-150715).

SUMMARY

According to an aspect of the embodiments, a liquid immersion tank to store a coolant includes an outer case configured to have a first hole in a side wall of the outer case and an opening at a top of the outer case, an inner case configured to have a second hole in a side wall of the inner case and an opening at a top of the inner case, the inner case being contained in the outer case and containing an electronic device to be cooled by the coolant, and a spring configured to support the inner case to be able to move between a first position and a second position disposed above the first position, cause, when the inner case is at the first position, the second hole to communicate with the first hole so that the coolant flow into the inner case, and cause, when the inner case is at the second position, the second hole to face the side wall of the outer case so that the coolant is prevented to flow into the inner case, wherein, when the inner case is at the second position, a part of the inner case projects upward relative to a specified position of a liquid level of the coolant.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

In a liquid immersion tank, removal of any of electronic units for, for example, replacement, lowers the liquid level of the coolant. In this case, cooling failure may be caused due to exposure of heat generating portions of the remaining electronic units in the liquid immersion tank. Here, it is conceivable that, in order to suppress the occurrences of cooling failure, the liquid immersion tank is replenished with the coolant. In this case, however, when the electronic unit is received in the liquid immersion tank for replacement or addition, the liquid level of the coolant may rise, and the coolant may overflow the liquid immersion tank. Accordingly, it is desired that variation of the liquid level of the coolant depending on the number of the electronic units received in the liquid immersion tank is able to be suppressed.

Hereinafter, an embodiments of a technique related to an liquid immersion tank are described. This liquid immersion tank may suppress variation of the liquid level of coolant in a main tank body.

First Embodiment

First, a first embodiment of the technique disclosed herein is described.

Figure 1:
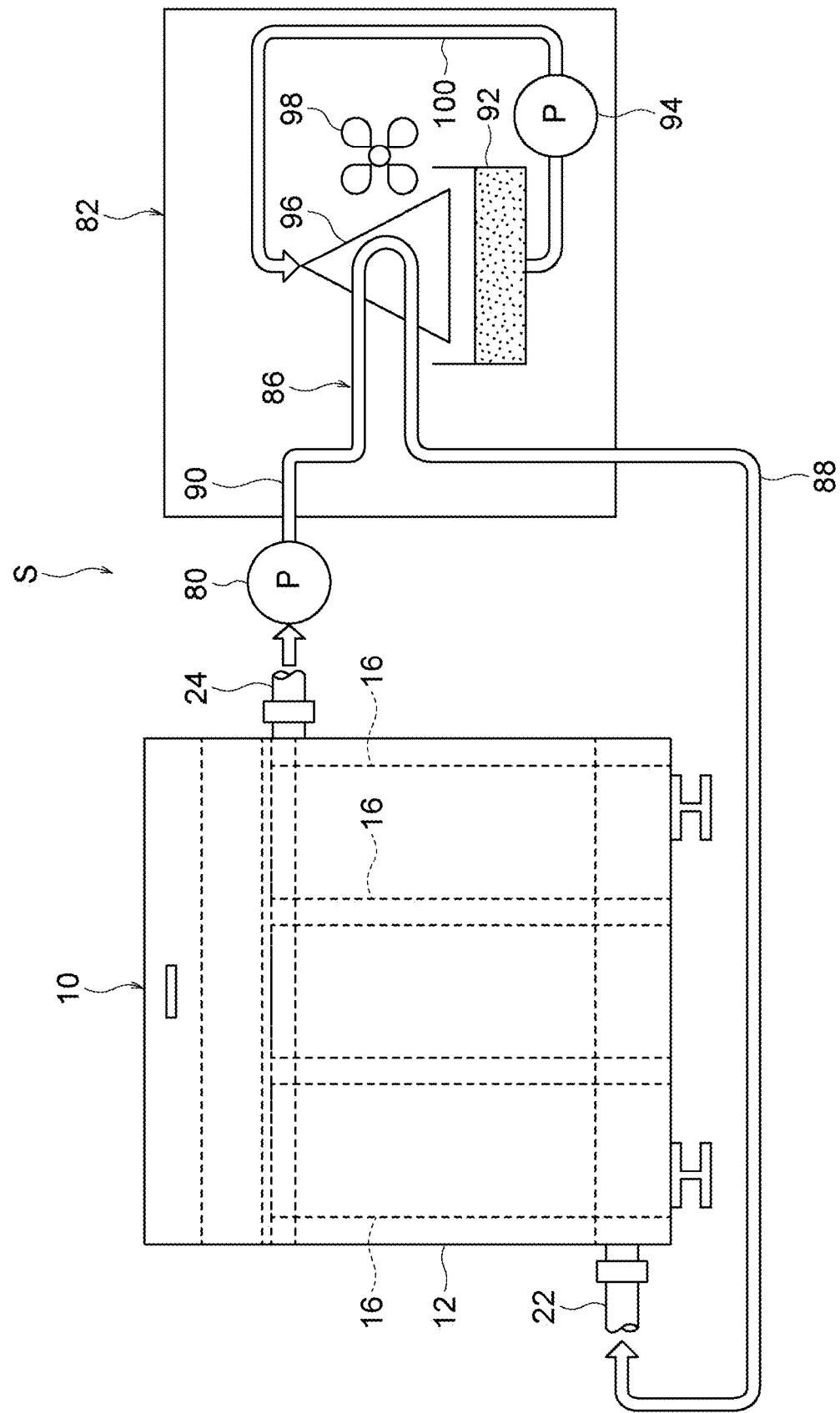
FIG. 1 schematically illustrates a cooling system to which a liquid immersion tank according to a first embodiment is applied.

FIG. 1 schematically illustrates a cooling system S to which an liquid immersion tank 10 according to a first embodiment is applied. The cooling system S includes the liquid immersion tank 10, a circulation pump 80, and a cooling tower 82.

As will be described later, coolant is stored in the liquid immersion tank 10. A plurality of electronic units are received in this liquid immersion tank 10. The electronic units are immersed in the coolant so as to be cooled. A coolant circulation circuit 86 is connected to the liquid immersion tank 10. The coolant circulation circuit 86 includes an outward pipe 88 and a return pipe 90. The circulation pump 80 is provided, for example, in the return pipe 90.

The cooling tower 82 includes a collecting container 92, a sprinkling pump 94, a heat exchanger 96, and a fan 98. A collecting pipe 100 is connected to the collecting container 92, and the sprinkling pump 94 is provided in the collecting pipe 100. The heat exchanger 96 is disposed above the collecting container 92, and the fan 98 is provided near the heat exchanger 96. The coolant circulation circuit 86 is thermally coupled to the heat exchanger 96.

In this cooling system S, when the circulation pump 80 is operated, the coolant circulates between the liquid immersion tank 10 and the cooling tower 82 through the coolant circulation circuit 86. In the cooling tower 82 at this time, the sprinkling pump 94 is operated, and water in the collecting container 92 is transported to the heat exchanger 96 through the collecting pipe 100 and sprinkled over the heat exchanger 96. The water sprinkled over the heat exchanger 96 is collected in the collecting container 92. Furthermore, the fan 98 is operated so as to cool the heat exchanger 96. Thus, the coolant is cooled by the heat exchanger 96 and this cooled coolant is supplied to the liquid immersion tank 10.

Next, the structure of the liquid immersion tank 10 according to the first embodiment is described in more detail.

Figure 2:
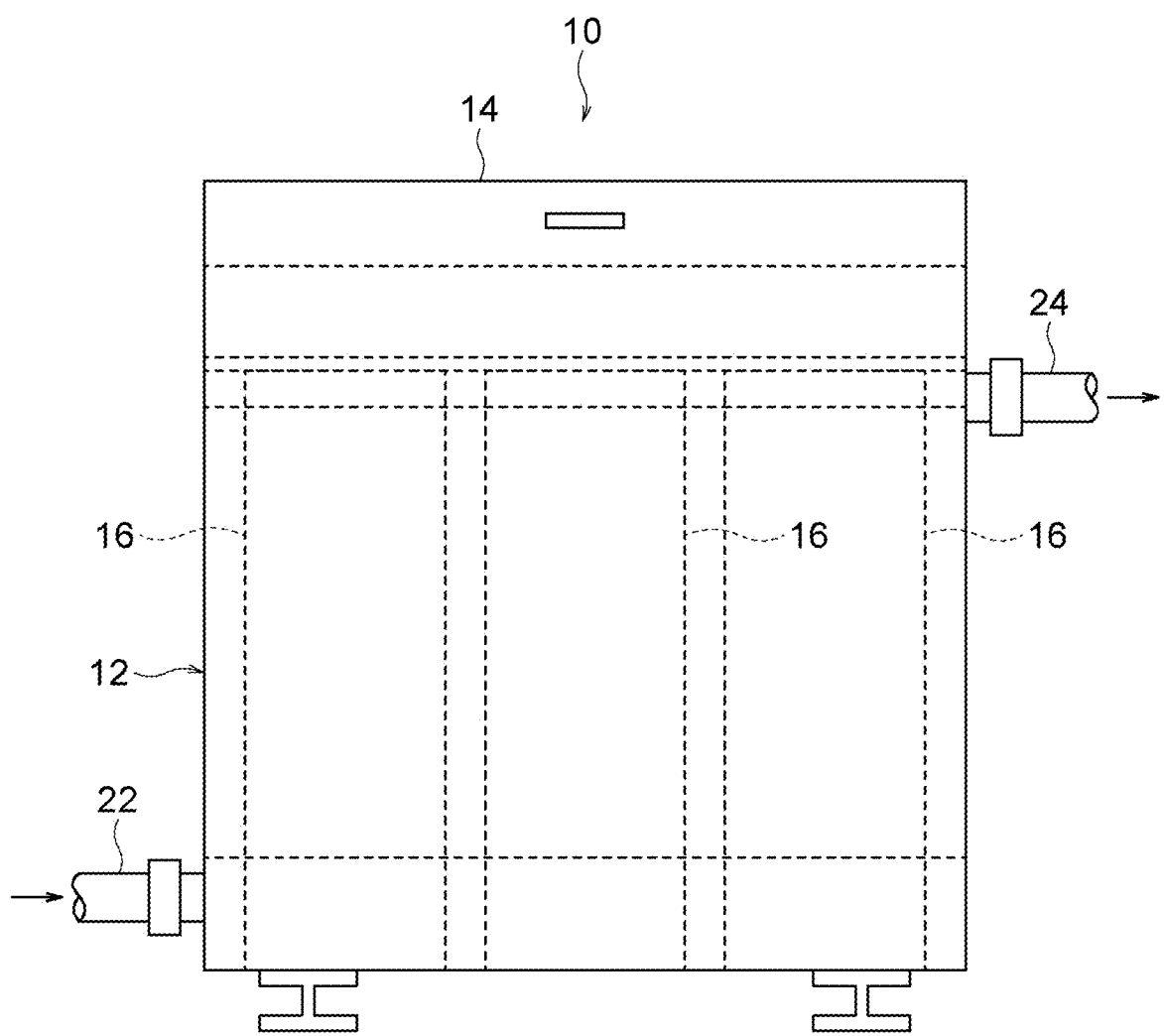
FIG. 2 is a front view of the liquid immersion tank according to the first embodiment.
Figure 3:
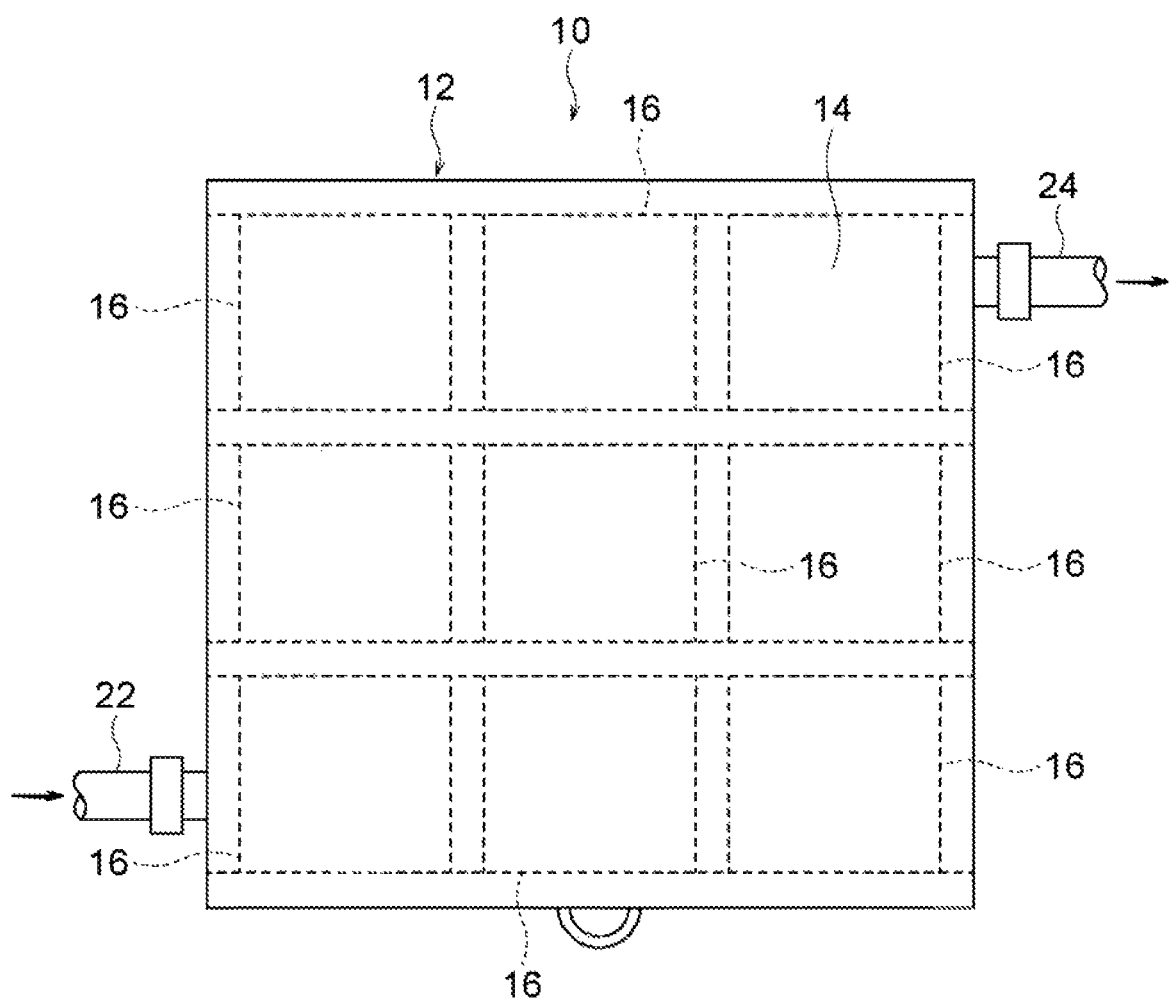
FIG. 3 is a top view of the liquid immersion tank illustrated in FIG. 2.
Figure 4:
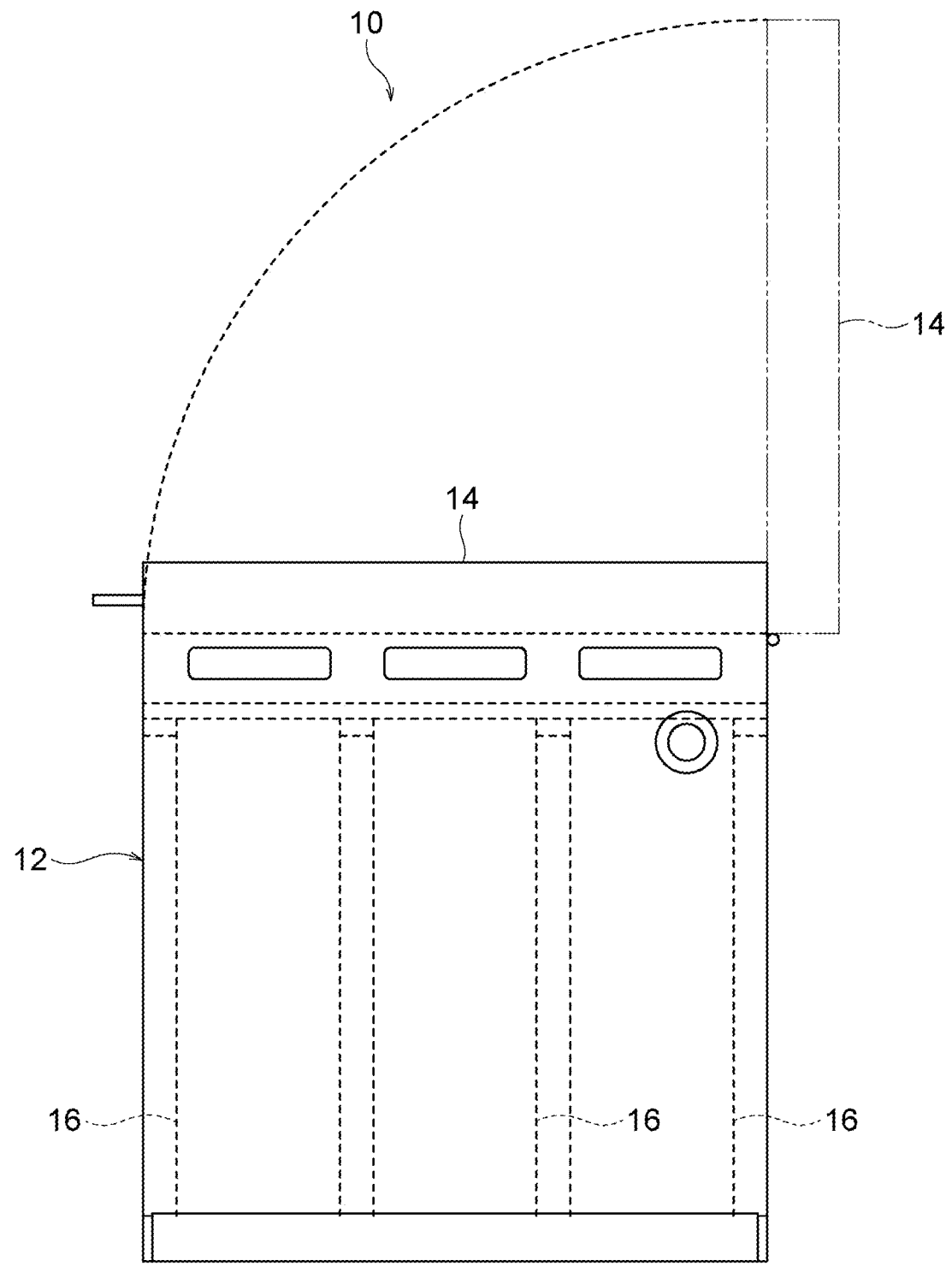
FIG. 4 is a side view of the liquid immersion tank illustrated in FIG. 2.

As illustrated in FIGS. 2 to 4, the liquid immersion tank 10 according to the first embodiment includes a main tank body 12, a lid 14, and a plurality of receiving units 16. The main tank body 12 has a box shape that is open at the top thereof. The lid 14 is openably provided at the top of the main tank body 12. The receiving units 16 receive respective electronic units and are provided in the main tank body 12. According to the first embodiment, for example, the receiving units 16 are arranged in the width direction and the depth direction of the main tank body 12 such that the receiving units 16 are arrayed in a three-by-three matrix. Thus, nine of the receiving units 16 are disposed in the liquid immersion tank 10.

Figure 5:
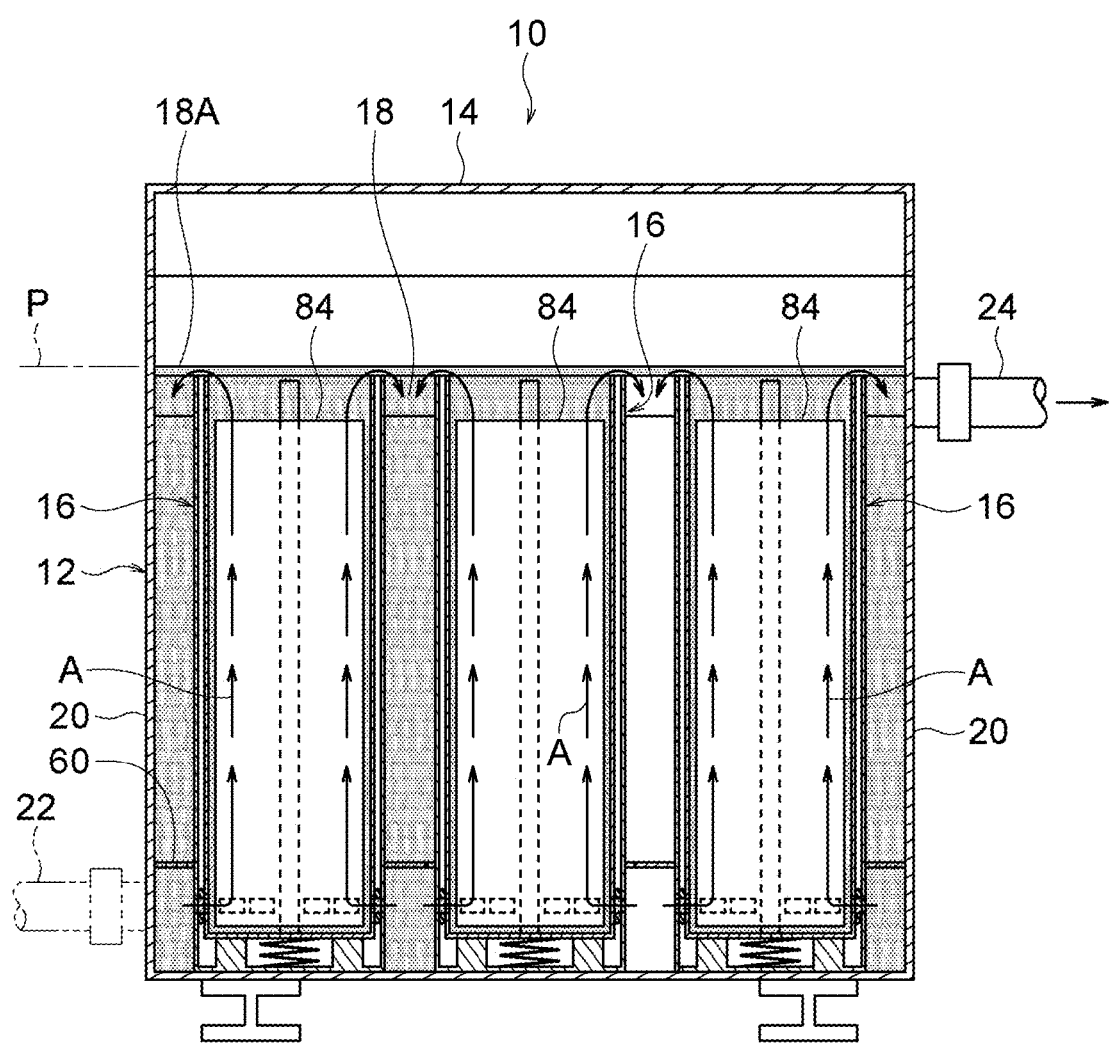
FIG. 5 is a longitudinal sectional view of the liquid immersion tank illustrated in FIG. 2 seen from front.

As illustrated in FIG. 5, coolant 18 is stored in the main tank body 12. As the coolant 18 (coolant liquid), for example, a fluorinated inert liquid or oil is used as a liquid having an insulating property and exhibiting high cooling efficiency. In the liquid immersion tank 10, the position of a liquid level 18A of the coolant 18 is specified in advance. During operation of the liquid immersion tank 10, for example, when electronic units 84 are received in the respective receiving units 16, the coolant 18 is stored in the main tank body 12 such that the liquid level 18A of the coolant 18 is at the above-described position specified in advance.

In FIG. 5, this position (level) specified in advance is indicated by a phantom line P. Hereinafter, this position of the liquid level 18A of the coolant 18 specified in advance is referred to as a specified position P of the liquid level 18A of the coolant 18. The specified position P is specified in accordance with the absolute height of the liquid immersion tank 10.

The main tank body 12 has a plurality of side walls 20. A coolant suction pipe 22 through which the coolant 18 is sucked into the main tank body 12 is connected to a lower portion of a first side wall 20 out of the above-described side walls 20. A coolant discharge pipe 24 through which the coolant 18 is discharged from the main tank body 12 is connected to an upper portion of a second side wall 20 out of the above-described side walls 20. The above-described outward pipe 88 (see FIG. 1) is connected to the coolant suction pipe 22, and the above-described return pipe 90 (see FIG. 1) is connected to the coolant discharge pipe 24. The coolant discharge pipe 24 is located below the specified position P of the liquid level 18A of the coolant 18.

Figure 6:
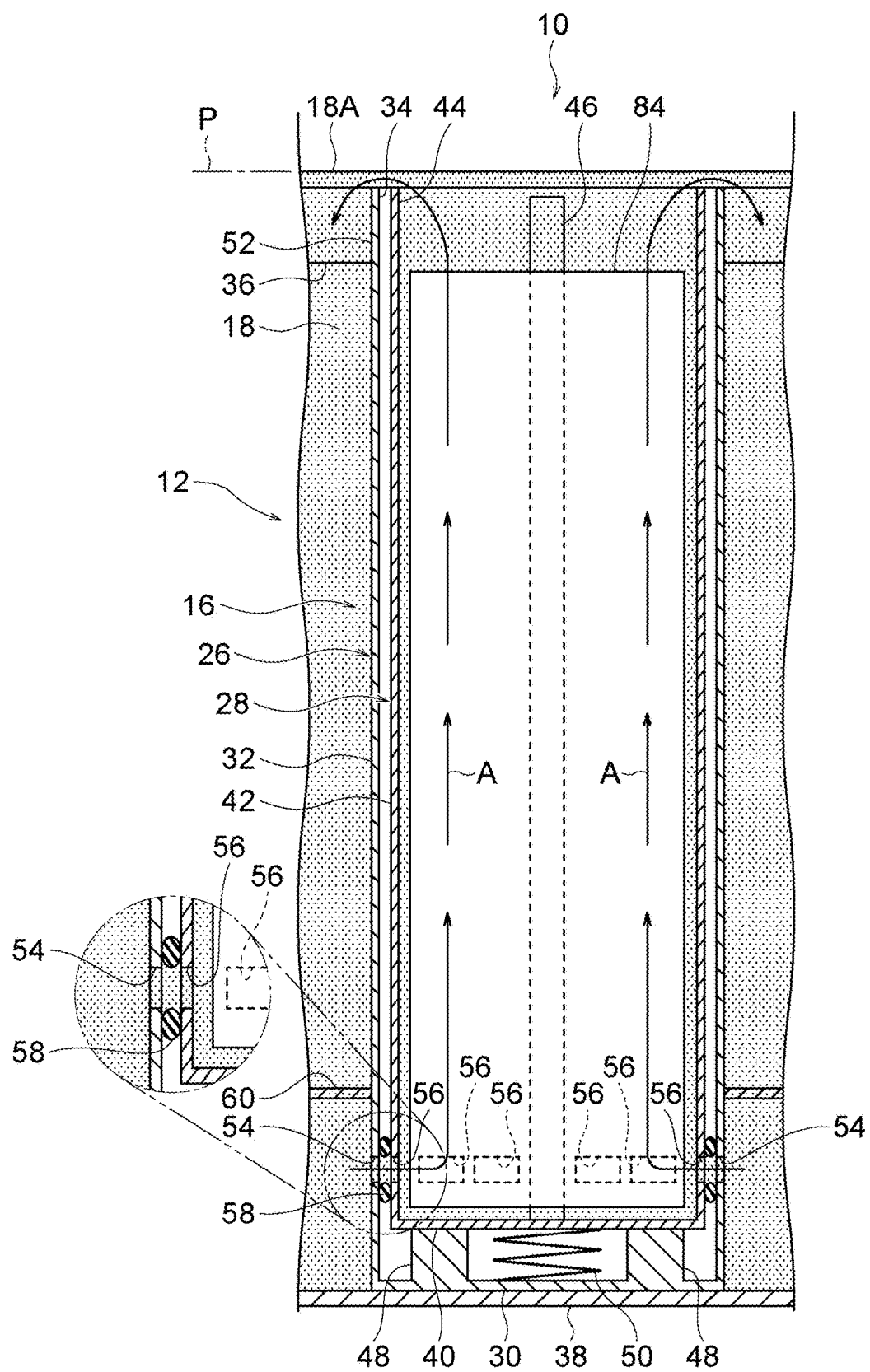
FIG. 6 is an enlarged view of a main portion of the liquid immersion tank illustrated in FIG. 5.

For example, the structures of the receiving units 16 are the same. As illustrated in FIG. 6, each of the receiving units 16 includes an outer case 26 and an inner case 28. The outer case 26 has a bottom wall 30 and a plurality of side walls 32. The top of the outer case 26 is open, and a first opening 34 is formed at the top of the outer case 26. The outer case 26 is disposed in the main tank body 12.

Securing portions 36 are provided at inner walls of the main tank body 12. The side walls 32 of the outer case 26 are secured to the main tank body 12 by using the securing portions 36. The bottom wall 30 of the outer case 26 overlaps the bottom wall 38 of the main tank body 12. In this way, the outer case 26 is secured to the main tank body 12, and the side walls 32 of the outer case 26 are located below the specified position P of the liquid level 18A of the coolant 18.

The inner case 28 has a bottom wall 40 and a plurality of side walls 42. The top of the inner case 28 is open, and a second opening 44 is formed at the top of the inner case 28. The inner case 28 is contained in the outer case 26 and receives one of the electronic units 84 therein. Rails 46 are provided at inner walls of the inner case 28 and support the electronic unit 84 received in the inner case 28.

For example, the inner case 28 is contained in the outer case 26 such that the inner case 28 is movable upward and downward. A plurality of supports 48 that project upward are formed on the bottom wall 30 of the outer case 26. The receiving unit 16 also includes an urging member 50. The urging member 50 is provided between the bottom wall 30 of the outer case 26 and the bottom wall 40 of the inner case 28. The urging member 50 urges the inner case 28 upward. The urging member 50 is an example of "follow-up mechanism". For example, a coil spring is applied to the urging member 50.

Figure 7:
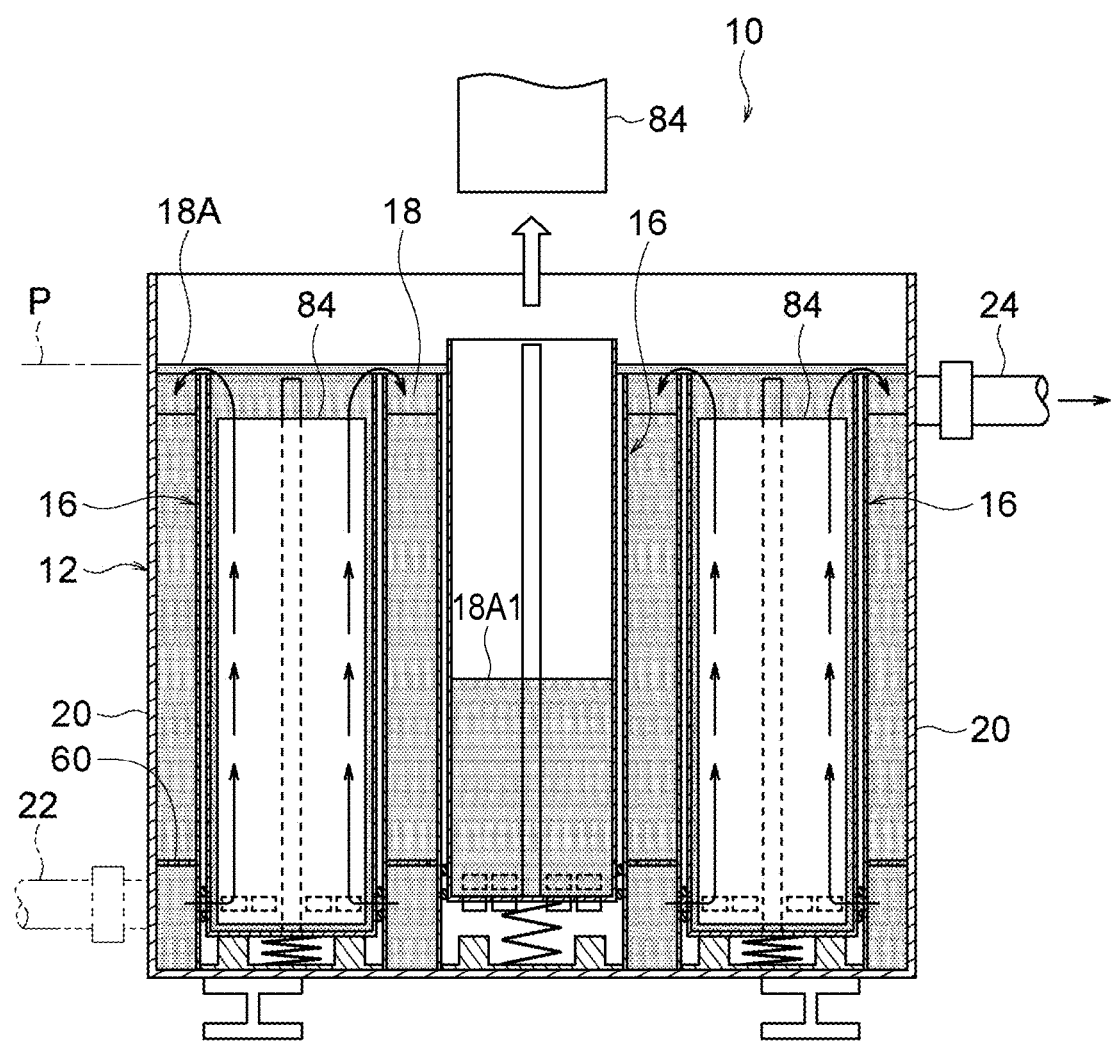
FIG. 7 illustrates a state in which a central one of electronic units is removed from the liquid immersion tank illustrated in FIG. 5.
Figure 8:
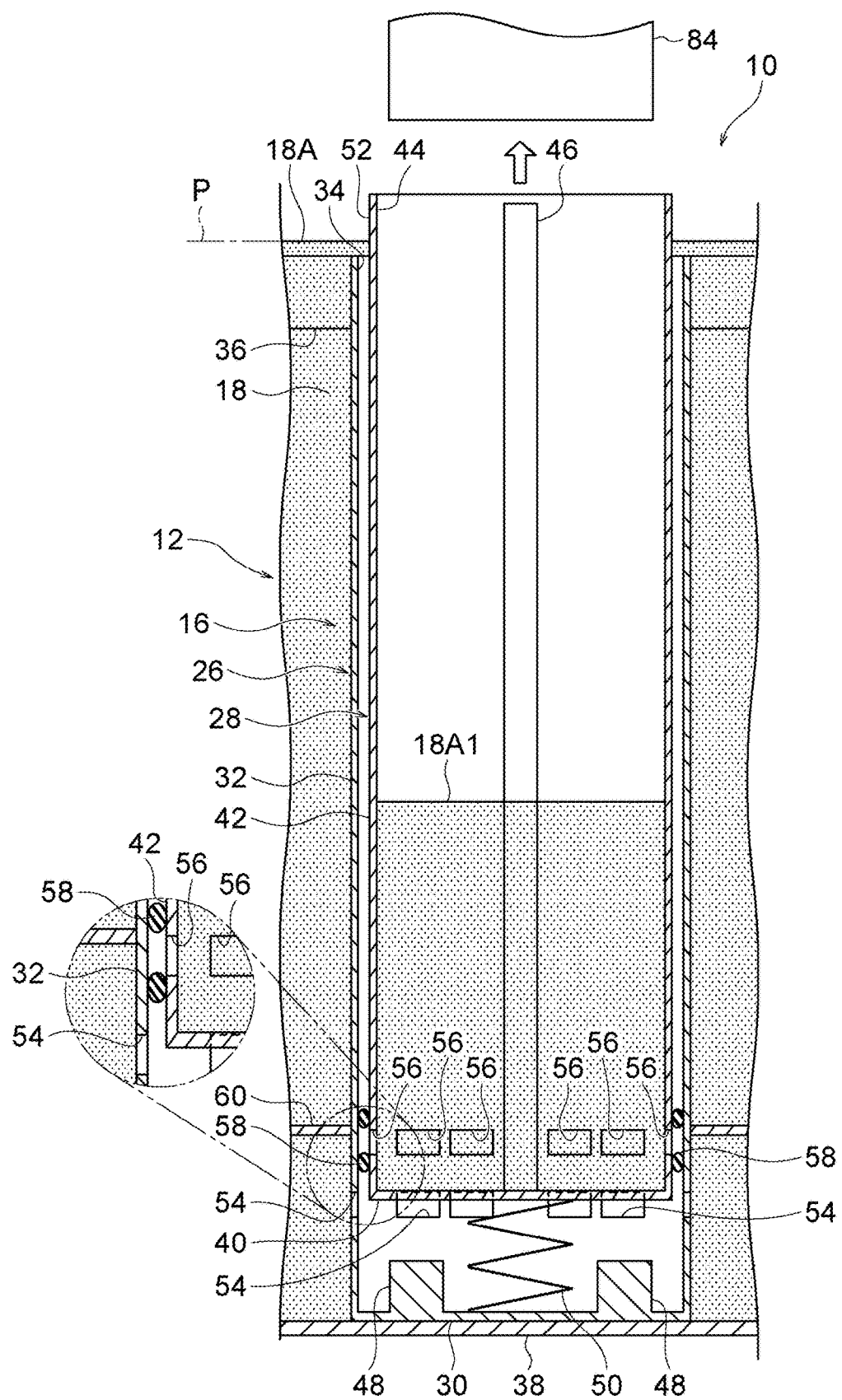
FIG. 8 is an enlarged view of a main portion of the liquid immersion tank illustrated in FIG. 7.

As illustrated in FIGS. 5 and 6, when the electronic unit 84 is received in the inner case 28, the inner case 28 is lowered due to the weight of the electronic unit 84. When the inner case 28 is lowered, the bottom wall 40 of the inner case 28 is supported by the supports 48 from below. In contrast, as illustrated in FIGS. 7 and 8, when the electronic unit 84 is removed from the inner case 28, the inner case 28 is raised due to an urging force of the urging member 50. A handle used to remove the electronic unit 84 from the inner case 28 may be attached to the electronic unit 84.

Hereinafter, when the electronic unit 84 is received in the inner case 28 and the inner case 28 is lowered due to the weight of the electronic unit 84, the position of this inner case 28 having been lowered is referred to as "lowered position". In contrast, when the electronic unit 84 is removed from the inner case 28 and the inner case 28 is raised due to the urging force of the urging member 50, the position of this inner case 28 having been raised is referred to as "raised position". As described above, the urging member 50 supports the inner case 28 such that the inner case 28 is upwardly and downwardly movable between the lowered position and the raised position located above the lowered position.

Upper ends of the side walls 42 of the inner case 28 form a projection 52. The projection 52 has an annular shape formed in the peripheral direction of the inner case 28 (receiving unit 16). As illustrated in FIG. 6, the projection 52 is formed at such a level that, when the inner case 28 is at the lowered position, the projection 52 is located below the specified position P of the liquid level 18A of the coolant 18. In contrast, as illustrated in FIG. 8, when the inner case 28 is at the raised position, the projection 52 formed at the above-described level projects upward relative to the specified position P of the liquid level 18A of the coolant 18.

As described above, at least when the inner case 28 is at the raised position, the projection 52 projects upward relative to the specified position P of the liquid level 18A of the coolant 18. Thus, the projection 52 functions as blocking walls that block, when the electronic unit 84 is removed from the inner case 28, flowing of the coolant 18 into the inner case 28 through the second opening 44.

As illustrated in FIG. 6, the outer case 26 has a plurality of first holes 54 (first flowback openings) at lower portions of the side walls 32 thereof. The first holes 54 are formed at the same level in the vertical direction of the outer case 26 and arranged in the peripheral direction of the outer case 26. Also, the inner case 28 has a plurality of second holes 56 (second flowback openings) at lower portions of the side walls 42 thereof. The second holes 56 are formed at the same level in the vertical direction of the inner case 28 and arranged in the peripheral direction of the inner case 28.

As illustrated in FIG. 6, the second holes 56 are formed at such a level that, when the inner case 28 is at the lowered position, the second holes 56 communicate with the respective first holes 54 and are open. In contrast, as illustrated in FIG. 8, when the inner case 28 is at the raised position, the second holes 56 formed at the above-described level face the side walls 32 of the outer case 26 and are closed. The urging member 50 has such an elastic force and dimensions that the urging member 50 causes, in the case where the inner case 28 is at the lowered position, the second holes 56 to communicate with the first holes 54 and to be open and, in the case where the inner case 28 is at the raised position, the second holes 56 to face the side walls 32 of the outer case 26 and to be closed. A plurality of sealing members 58 are provided between the outer case 26 and the inner case 28. The sealing members 58 have an annular shape such that the sealing members 58 surround the peripheries of the respective second holes 56. The sealing members 58 are secured to the side walls 42 of the inner case 28.

Furthermore, as illustrated in FIGS. 5 and 6, separation walls 60 are provided in the main tank body 12. The thickness direction of the separation walls 60 is coincident with the vertical direction of the main tank body 12. The separation walls 60 are provided between the side walls 20 of the main tank body 12 and the side walls 32 of the outer case 26. The separation walls 60 are located above the first holes 54 and the coolant suction pipe 22 and separate the inside of the main tank body 12 in the vertical direction.

Next, operations and effects according to the first embodiment are described.

As illustrated in FIGS. 5 and 6, when the electronic unit 84 is received in the inner case 28, the inner case 28 is lowered due to the weight of the electronic unit 84, and this inner case 28 moves to the lowered position. When the inner case 28 is at the lowered position, the second holes 56 communicate with the respective first holes 54 and are open. Furthermore, when the inner case 28 is at the lowered position, the projection 52 is located below the liquid level 18A of the coolant 18.

In this state, as indicated by arrows A illustrated in FIGS. 5 and 6, the coolant 18 sucked from the coolant suction pipe 22 flows into the inner case 28 through the first holes 54 and the second holes 56. The coolant 18 having flowed into the inner case 28 flows to the outside of the inner case 28 through the second opening 44. When the coolant 18 flows in the inner case 28 as described above, the electronic unit 84 received in the inner case 28 is able to be cooled.

In contrast, as illustrated in FIGS. 7 and 8, when the electronic unit 84 is removed from the inner case 28, the inner case 28 is raised due to an urging force of the urging member 50, and this inner case 28 moves to the raised position. When the inner case 28 is at the raised position, the second holes 56 face the side walls 32 of the outer case 26 and are closed. Furthermore, when the inner case 28 is at the raised position, the projection 52 projects upward relative to the liquid level 18A of the coolant 18.

In this state, flowing of the coolant 18 into the inner case 28 through the second holes 56 and the second opening 44 is suppressed. Thus, even when the electronic unit 84 is removed, variation of the liquid level 18A of the coolant 18 in the main tank body 12 may be suppressed. This may suppress the occurrences of cooling failure due to exposure of heat generating portions of the remaining electronic units 84 in the main tank body 12 and also suppress the occurrences of circulation failure of the coolant 18 due to exposure of the coolant discharge pipe 24. Furthermore, replenishment with the coolant 18 is not required, and accordingly, an increase in cost may be suppressed.

When the electronic unit 84 is removed, a liquid level 18A1 of the coolant 18 in the inner case 28 is lowered by the distance corresponding to the volume of the electronic unit 84. Thus, even when the electronic unit 84 is received again in the inner case 28, the liquid level 18A1 of the coolant 18 in the inner case 28 only returns to the original level. Accordingly, variation of the liquid level 18A of the coolant 18 in the main tank body 12 may be suppressed. This may drop a demand for an anti-overflow mechanism that suppresses the occurrences of a situation in which the coolant 18 overflows the main tank body 12. Accordingly, the increase in cost may be suppressed.

Furthermore, the urging member 50 that urges the inner case 28 upward is provided between the bottom wall 30 of the outer case 26 and the bottom wall 40 of the inner case 28. Thus, when the electronic unit 84 is removed, the inner case 28 is able to follow the removal of the electronic unit 84 so as to smoothly move to the raised position. This may allow, when the electronic unit 84 is removed, the second holes 56 to be quickly closed and the projection 52 to quickly project upward relative to the liquid level 18A of the coolant 18. As a result, flowing of the coolant 18 into the inner case 28 may be quickly blocked, and accordingly, variation of the liquid level 18A of the coolant 18 in the main tank body 12 may be more effectively suppressed.

Furthermore, the separation walls 60 are provided in the main tank body 12. The separation walls 60 are located above the first holes 54 and the coolant suction pipe 22 and separate the inside of the main tank body 12 in the vertical direction. Thus, the coolant 18 sucked from the coolant suction pipe 22 is able to be guided by the separation walls 60 to the first holes 54 and the second holes 56. This may increase the flow amount of the coolant 18 flowing into the inner case 28. Accordingly, cooling performance for the electronic unit 84 received in the inner case 28 may be improved.

Next, an example of the first embodiment is described.

Table 1 illustrates comparison of the liquid immersion tank 10 according to the first embodiment with an liquid immersion tank according to a comparative example in terms of the relationships between the number of received electronic units 84 and the liquid level 18A of the coolant 18 in the main tank body 12. Compared to the liquid immersion tank 10 according to the first embodiment, the liquid immersion tank according to the comparative example has a structure in which the receiving units 16 or the separation walls 60 are not provided.

As illustrated in Table 1, when the number of received electronic units 84 is reduced, the liquid level 18A of the coolant 18 is lowered in the liquid immersion tank according to the comparative example. Thus, when the number of the received electronic units 84 is reduced to a certain value or smaller, cooling failure may be caused due to exposure of the heat generating portions of the remaining electronic units 84 in the main tank body 12 and circulation failure of the coolant 18 may be caused due to exposure of the coolant discharge pipe 24.

Table 2 illustrates comparison of the relationships between the number of received electronic units 84 and the amount for replenishing, with the coolant 18, the liquid immersion tank according to the comparative example required to maintain the liquid level 18A of the coolant 18. As illustrated in Table 2, the liquid immersion tank according to the comparative example is required to be replenished with the coolant 18 when the number of the received electronic units 84 is reduced to a certain value or smaller (for example, eight or smaller). This may increase the cost.

In contrast, it is understood that, as illustrated in Table 1, even when the number of received electronic units 84 is reduced, the liquid level 18A of the coolant 18 is substantially unvarying in the liquid immersion tank 10 according to the first embodiment. This may suppress the occurrences of cooling failure due to exposure of the heat generating portions of the remaining electronic units 84 in the main tank body 12 and also suppress the occurrences of circulation failure of the coolant 18 due to exposure of the coolant discharge pipe 24. Furthermore, replenishment with the coolant 18 is not required, and accordingly, the increase in cost may be suppressed.

TABLE 1

| Number of received electronic units | Liquid level according to first embodiment [m] | Liquid level according to comparative example [m] |
| --- | --- | --- |
| 9 | 0.700 | 0.700 |
| 8 | 0.699 | 0.678 |
| 7 | 0.697 | 0.657 |
| 6 | 0.696 | 0.637 |
| 5 | 0.694 | 0.619 |
| 4 | 0.693 | 0.602 |
| 3 | 0.691 | 0.585 |
| 2 | 0.690 | 0.570 |
| 1 | 0.688 | 0.555 |
| 0 | 0.687 | 0.541 |

TABLE 2

| Number of received electronic units | Coolant replenishment amount [L] |
| --- | --- |
| 9 | 0.0 |
| 8 | 9.2 |
| 7 | 18.3 |
| 6 | 27.5 |
| 5 | 36.7 |
| 4 | 45.9 |
| 3 | 55.0 |
| 2 | 64.2 |
| 1 | 73.4 |
| 0 | 82.6 |

Next, variations of the first embodiment are described.

According to the first embodiment, as an example, the number of the plurality of receiving units 16 in the liquid immersion tank 10 is nine. However, the number of the receiving units 16 may be other than nine.

Furthermore, according to the first embodiment, the inner case 28 follows the removal of the electronic unit 84 so as to move to the raised position. Thus, the urging member 50 that urges upward the inner case 28 is provided. However, a mechanism that follows the removal of the electronic unit 84 so as to move the inner case 28 to the raised position and that moves the inner case 28 to the lowered position when the electronic unit 84 is received may be provided instead of the urging member 50.

Second Embodiment

Next, a second embodiment of the technique disclosed herein is described.

The structure of an liquid immersion tank 70 according to the second embodiment illustrated in FIGS. 9 to 12 is changed from the structure of the liquid immersion tank 10 (FIGS. 5 to 8) according to the above-described first embodiment as follows.

Figure 10:
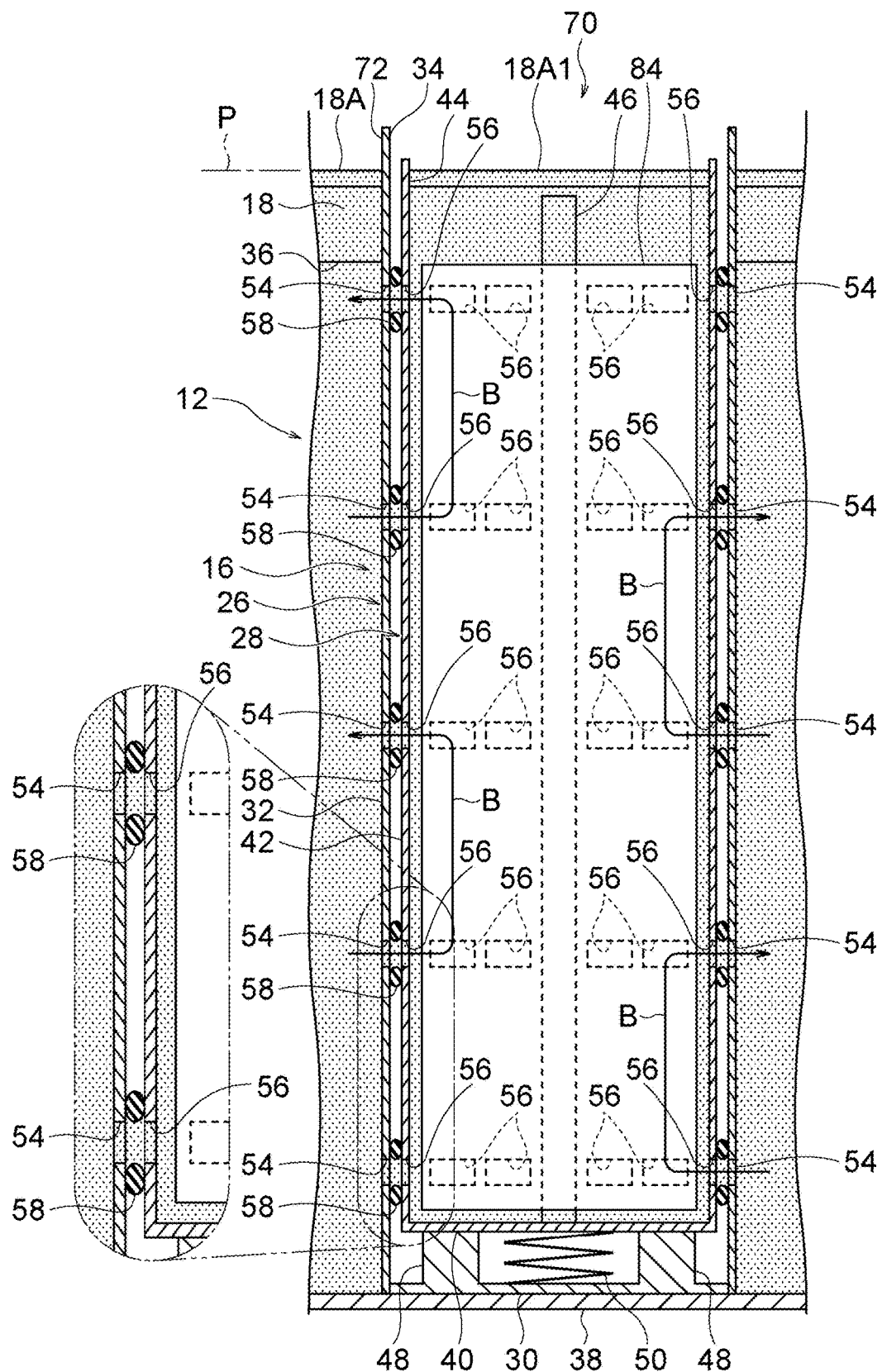
FIG. 10 is an enlarged view of a main portion of the liquid immersion tank illustrated in FIG. 9.

For example, upper ends of the side walls 32 of the outer case 26 form a projection 72. The projection 72 has an annular shape formed in the peripheral direction of the outer case 26 (receiving unit 16). As illustrated in FIG. 10, the projection 72 is formed at such a level that the projection 72 is located above the specified position P of the liquid level 18A of the coolant 18.

Figure 12:
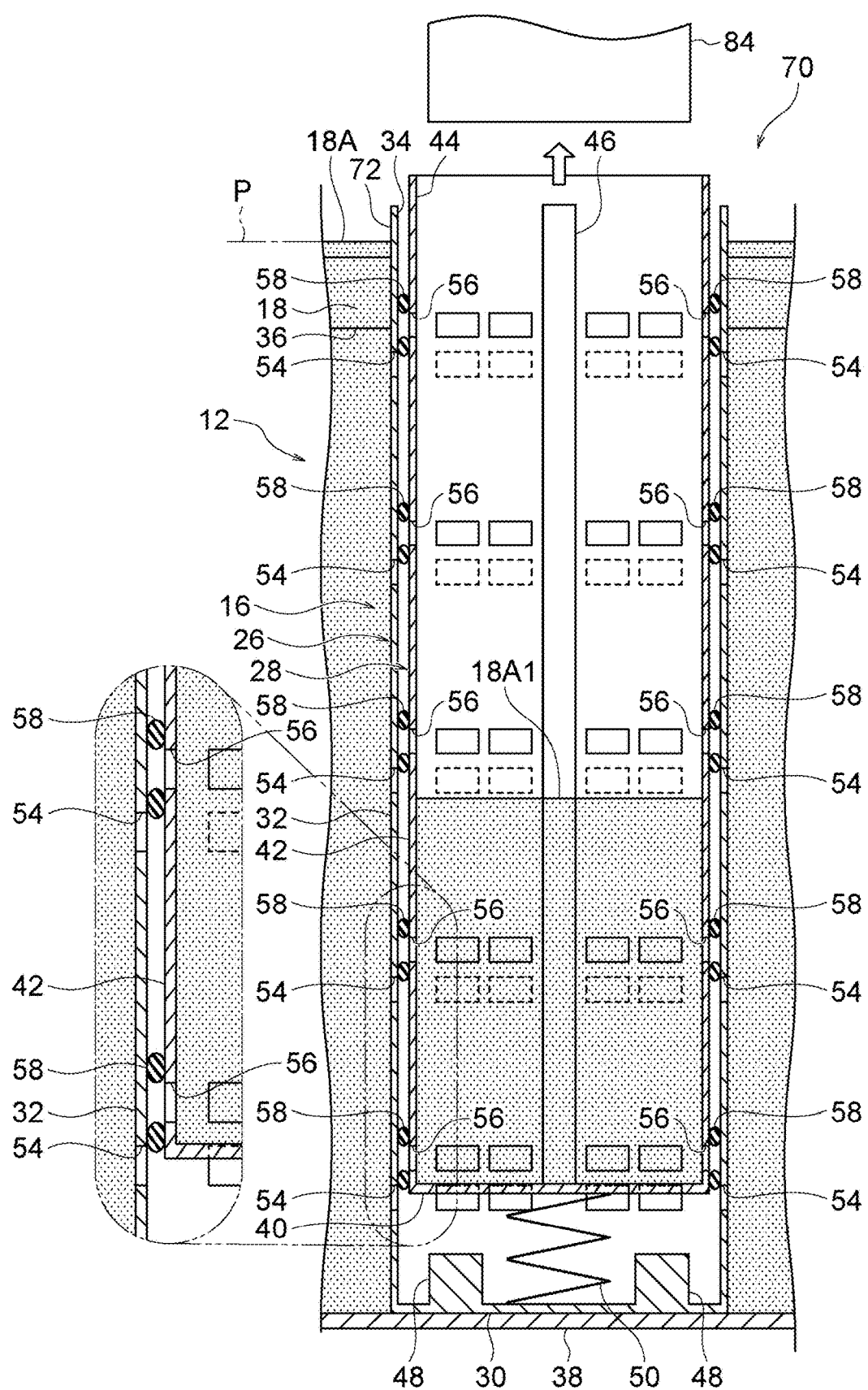
FIG. 12 is an enlarged view of a main portion of the liquid immersion tank illustrated in FIG. 11.

As described above, the projection 72 is formed at the side walls 32 of the outer case 26 secured to the main tank body 12. Thus, when the inner case 28 is at the lowered position as illustrated in FIG. 10 and at the raised position as illustrated in FIG. 12, the projection 72 projects upward relative to the specified position P of the liquid level 18A of the coolant 18. Thus, the projection 72 functions as blocking walls that block, when the electronic unit 84 is removed from the inner case 28, flowing of the coolant 18 into the inner case 28 through the second opening 44.

Furthermore, the first holes 54 are formed in the side walls 32 of the outer case 26 so as to be arranged in the vertical direction. The first holes 54 are also arranged in the peripheral direction of the outer case 26. Likewise, the second holes 56 are formed in the side walls 42 of the inner case 28 so as to be arranged in the vertical direction. The second holes 56 are also arranged in the peripheral direction of the inner case 28.

As illustrated in FIG. 10, the second holes 56 are formed at such a level that, when the inner case 28 is at the lowered position, the second holes 56 communicate with the respective first holes 54 and are open. In contrast, as illustrated in FIG. 12, when the inner case 28 is at the raised position, the second holes 56 formed at the above-described level face the side walls 32 of the outer case 26 and are closed. The sealing members 58 are provided between the outer case 26 and the inner case 28. The sealing members 58 have an annular shape such that the sealing members 58 surround the peripheries of the respective second holes 56. The sealing members 58 are secured to the side walls 42 of the inner case 28.

None of the separation walls 60 (see FIGS. 5 to 8) are provided in the main tank body 12 according to the second embodiment.

Next, operations and effects according to the second embodiment are described.

Figure 9:
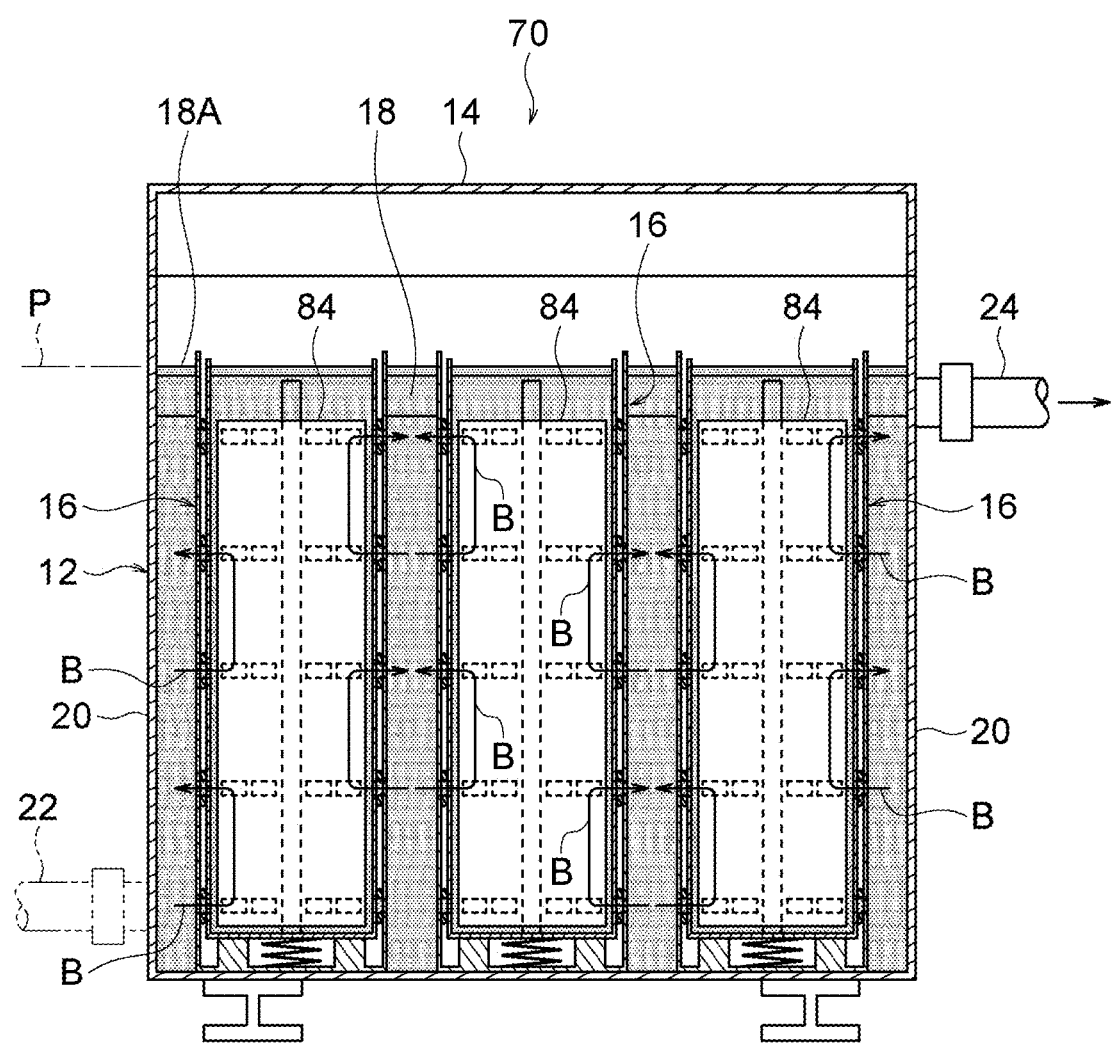
FIG. 9 is a longitudinal sectional view of an liquid immersion tank according to a second embodiment seen from front.

As illustrated in FIGS. 9 and 10, when the electronic unit 84 is received in the inner case 28, the inner case 28 is lowered due to the weight of the electronic unit 84, and this inner case 28 moves to the lowered position. When the inner case 28 is at the lowered position, the second holes 56 communicate with the respective first holes 54 and are open.

In this state, as indicated by arrows B illustrated in FIGS. 9 and 10, the coolant 18 sucked from the coolant suction pipe 22 flows into the inner case 28 through some of the first holes 54 and some of the second holes 56. The coolant 18 having flowed into the inner case 28 flows to the outside of the inner case 28 through the other first holes 54 and the other second holes 56. When the coolant 18 flows in the inner case 28 as described above, the electronic unit 84 received in the inner case 28 is able to be cooled. The flows indicated by the arrows B, which depend on a circulation mechanism and the like in the inner case 28 or the electronic unit 84, are only examples.

Figure 11:
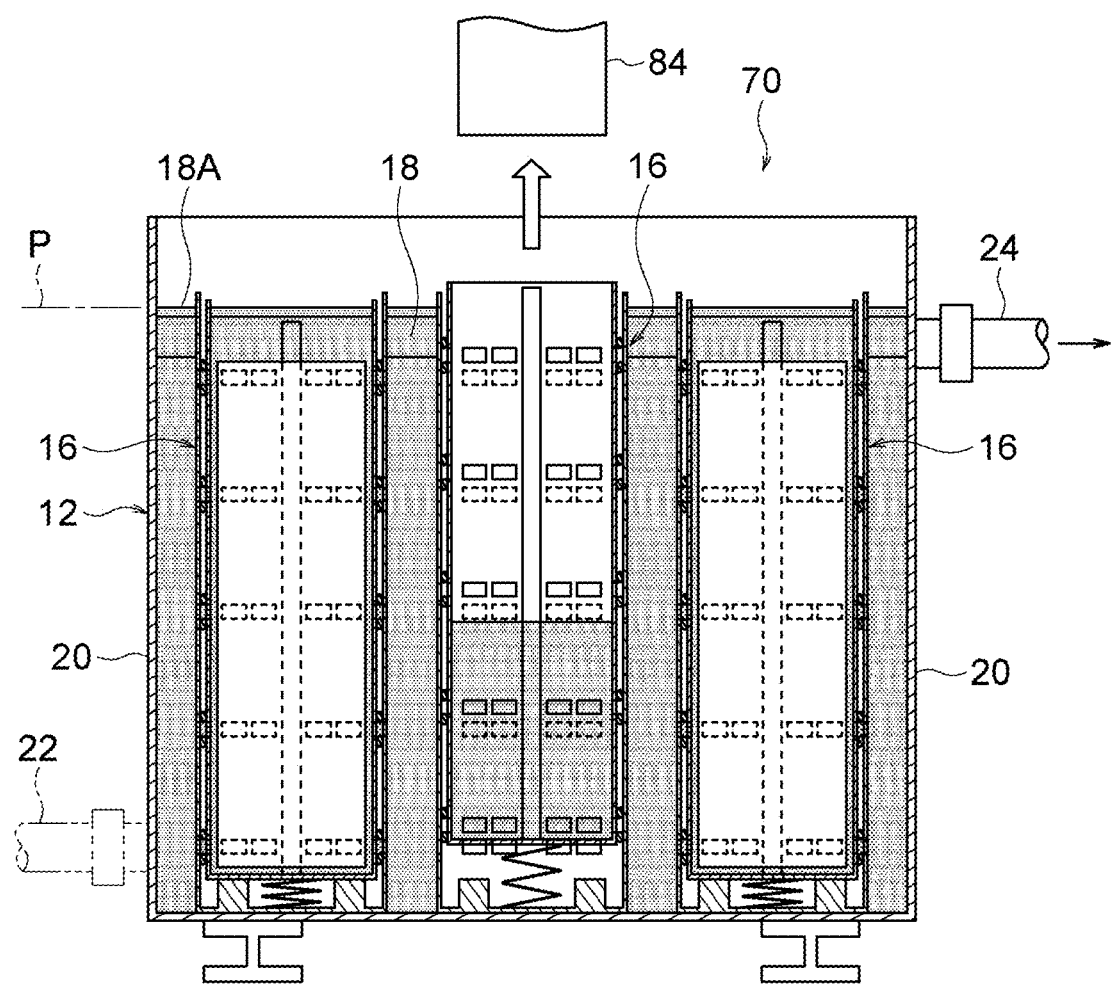
FIG. 11 illustrates a state in which a central one of the electronic units is removed from the liquid immersion tank illustrated in FIG. 9.

In contrast, as illustrated in FIGS. 11 and 12, when the electronic unit 84 is removed from the inner case 28, the inner case 28 is raised due to the urging force of the urging member 50, and this inner case 28 moves to the raised position. When the inner case 28 is at the raised position, the second holes 56 face the side walls 32 of the outer case 26 and are closed. As described above, at least when the inner case 28 is at the raised position, the projection 72 projects upward relative to the liquid level 18A of the coolant 18.

In this state, flowing of the coolant 18 into the inner case 28 through the second holes 56 and the second opening 44 is suppressed. Thus, even when the electronic unit 84 is removed, variation of the liquid level 18A of the coolant 18 in the main tank body 12 may be suppressed. This may suppress the occurrences of cooling failure due to exposure of the heat generating portions of the remaining electronic units 84 in the main tank body 12 and also suppress the occurrences of circulation failure of the coolant 18 due to exposure of the coolant discharge pipe 24. Furthermore, replenishment with the coolant 18 is not required, and accordingly, the increase in cost may be suppressed.

When the electronic unit 84 is removed, the liquid level 18A1 of the coolant 18 in the inner case 28 is lowered by the distance corresponding to the volume of the electronic unit 84. Thus, even when the electronic unit 84 is received again in the inner case 28, the liquid level 18A1 of the coolant 18 in the inner case 28 only returns to the original level. Accordingly, variation of the liquid level 18A of the coolant 18 in the main tank body 12 may be suppressed. This may drop a demand for an anti-overflow mechanism that suppresses the occurrences of a situation in which the coolant 18 overflows the main tank body 12. Accordingly, the increase in cost may be suppressed.

Furthermore, the urging member 50 that urges the inner case 28 upward is provided between the bottom wall 30 of the outer case 26 and the bottom wall 40 of the inner case 28. Thus, when the electronic unit 84 is removed, the inner case 28 is able to follow the removal of the electronic unit 84 so as to smoothly move to the raised position. Thus, in removing the electronic unit 84, the second holes 56 are able to be quickly closed. As a result, flowing of the coolant 18 into the inner case 28 may be quickly blocked, and accordingly, variation of the liquid level 18A of the coolant 18 in the main tank body 12 may be more effectively suppressed.

Next, variations of the second embodiment are described.

Although the projection 72 is formed at the side walls 32 of the outer case 26 according to the second embodiment, the projection 72 may be formed at the side walls 42 of the inner case 28 as is the case with the first embodiment. In this case, when the inner case 28 is at the raised position, the projection 72 may project upward relative to the specified position P of the liquid level 18A of the coolant 18 so as to block flowing of the coolant 18 into the inner case 28 through the second opening 44.

Also, the variations of the above-described first embodiment may be applied to the second embodiment.

Although the first and second embodiments of the technique disclosed herein have been described, the technique disclosed herein is not limited to the above description. Of course, in addition to the above description, the technique disclosed herein is able to be varied in a variety of manners and embodied without departing from the gist thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A liquid immersion tank to store a coolant, the liquid immersion tank comprising:
   an outer case configured to have a first hole in a side wall of the outer case and an opening at a top of the outer case;
   an inner case configured to have a second hole in a side wall of the inner case and an opening at a top of the inner case, the inner case being contained in the outer case and containing an electronic device to be cooled by the coolant; and
   a spring configured to:
   support the inner case to be able to move between a first position and a second position disposed above the first position,
   cause, when the inner case is at the first position, the second hole to communicate with the first hole so that the coolant flows into the inner case, and
   cause, when the inner case is at the second position, the second hole to face the side wall of the outer case so that the coolant is prevented to flow into the inner case,
   wherein, when the inner case is at the second position, a part of the inner case projects upward relative to a specified position of a liquid level of the coolant.

2. The liquid immersion tank according to claim 1, wherein the spring urges the inner case upward.

3. The liquid immersion tank according to claim 1, wherein the side wall of the outer case is located below the specified position of the liquid level of the coolant, and
   wherein the part of the inner case is formed at the side wall of the inner case and, when the inner case is at the first position, the part of the inner case is located below the specified position of the liquid level of the coolant.

4. The liquid immersion tank according to claim 3, wherein the first hole is formed in a lower portion of the side wall of the outer case, and
   wherein the second hole is formed in a lower portion of the side wall of the inner case.

5. The liquid immersion tank according to claim 4, further comprising:
   a coolant suction pipe formed in a lower portion of a side wall of the liquid immersion tank to allow the coolant to be sucked through the coolant suction pipe; and
   a separation wall located above the first hole and the coolant suction pipe and configured to separate inside of the liquid immersion tank in a vertical direction in the liquid immersion tank.

6. The liquid immersion tank according to claim 1, wherein a part of the outer case that is formed at the side wall of the outer case projects upward relative to the specified position of the liquid level of the coolant.

7. The liquid immersion tank according to claim 6, wherein the side wall of the outer case includes a plurality of first holes arranged in a vertical direction, and wherein the side wall of the inner case includes a plurality of second holes arranged in the vertical direction.

8. The liquid immersion tank according to claim 1, further comprising:
a coolant discharge pipe formed in an upper portion of a side wall of the liquid immersion tank, located below the specified position of the liquid level of the coolant, and configured to allow the coolant to be discharged through the coolant discharge pipe.

9. The liquid immersion tank according to claim 1, further comprising:
a seal provided between the outer case and the inner case, configured to surround a periphery of the second hole and be secured to the side wall of the inner case.

10. The liquid immersion tank according to claim 3, wherein the part of the inner case has an annular shape formed in a peripheral direction of the inner case.

11. The liquid immersion tank according to claim 6, wherein the part of the outer case has an annular shape formed in a peripheral direction of the outer case.

12. The liquid immersion tank according to claim 10, wherein the part of the inner case is a blocking wall configured to block flowing of the coolant into the inner case.

13. The liquid immersion tank according to claim 11, wherein the part of the outer case is a blocking wall configured to block flowing of the coolant into the inner case.

* * * * *